(12) United States Patent
Ottens et al.

(10) Patent No.: US 7,161,662 B2
(45) Date of Patent: Jan. 9, 2007

(54) LITHOGRAPHIC APPARATUS, DEVICE MANUFACTURING METHOD, AND DEVICE MANUFACTURED THEREBY

(75) Inventors: Joost Jeroen Ottens, Veldhoven (NL); Tjarko Adriaan Rudolf Van Empel, Eindhoven (NL); Koen Jacobus Johannes Maria Zaal, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 93 days.

(21) Appl. No.: 10/890,379

(22) Filed: Jul. 14, 2004

(65) Prior Publication Data

US 2005/0030515 A1 Feb. 10, 2005

(30) Foreign Application Priority Data

Jul. 15, 2003 (EP) .................................. 03077222

(51) Int. Cl.
*G03B 27/58* (2006.01)
*G03B 27/62* (2006.01)
*G23B 5/22* (2006.01)
*G23B 31/28* (2006.01)

(52) U.S. Cl. .......................... 355/72; 355/75; 279/128

(58) Field of Classification Search ................. 355/72, 355/75; 316/234; 279/128
See application file for complete search history.

(56) References Cited

U.S. PATENT DOCUMENTS

| 4,554,611 | A | * | 11/1985 | Lewin ........................ 361/234 |
| 5,094,536 | A | | 3/1992 | MacDonald et al. |
| 5,530,616 | A | * | 6/1996 | Kitabayashi et al. ........ 361/234 |
| 5,532,903 | A | | 7/1996 | Kendall |
| 5,646,814 | A | * | 7/1997 | Shamouilian et al. ....... 361/234 |
| 5,838,529 | A | | 11/1998 | Shufflebotham et al. |
| 5,886,863 | A | * | 3/1999 | Nagasaki et al. ........... 361/234 |
| 6,268,994 | B1 | * | 7/2001 | Logan et al. ............... 361/234 |
| 6,307,620 | B1 | | 10/2001 | Takabayashi et al. |
| 6,710,857 | B1 | * | 3/2004 | Kondo ....................... 355/72 |
| 6,768,627 | B1 | * | 7/2004 | Kitabayashi et al. ........ 361/234 |
| 2002/0159217 | A1 | * | 10/2002 | Tsuruta et al. .............. 361/234 |
| 2003/0098965 | A1 | * | 5/2003 | Binnard et al. .............. 355/73 |
| 2004/0114124 | A1 | | 6/2004 | Hocks et al. |

FOREIGN PATENT DOCUMENTS

| EP | 0 138 254 B1 | 6/1988 |
| EP | 0 452 222 B1 | 1/1997 |
| EP | 0 993 024 A2 | 4/2000 |
| EP | 1 077 393 A2 | 2/2001 |

OTHER PUBLICATIONS

European Search Report for European Patent Application No. 03077222.2, completed Apr. 26, 2004.

* cited by examiner

*Primary Examiner*—Rodney Fuller
*Assistant Examiner*—Marissa A. Ohira
(74) *Attorney, Agent, or Firm*—Pillsbury Winthrop Shaw Pittman LLP

(57) ABSTRACT

A lithographic projection apparatus includes a radiation system for providing a beam of radiation, and a substrate holder. The substrate holder includes a plurality of protrusions for providing a substantially flat plane of support for supporting a substrate in a beam path of the beam of radiation, at least one clamping electrode for generating an electric field for clamping the substrate against the substrate holder, and a peripheral supporting edge arranged to contact the substrate. The electrode extends beyond the peripheral supporting edge for providing a torsion load to level the substrate near the edges of the substrate.

15 Claims, 5 Drawing Sheets

LITHOGRAPHIC APPARATUS, DEVICE MANUFACTURING METHOD, AND DEVICE MANUFACTURED THEREBY

CROSS-REFERENCE TO RELATED APPLICATIONS

This application claims the benefit of priority from European Patent Application No. 3077222.2, filed Jul. 15, 2003, the entire content of which is incorporated herein by reference.

FIELD

The present invention relates to a lithographic projection apparatus, a device manufacturing method, and a device manufactured thereby.

BACKGROUND

Known electrostatic clamps that are used for substrate holders are usually provided with means for using a backfill gas, which is used to fill the spaces formed between protrusions located on the holder, a base plate that forms a ground layer for supporting the protrusions, and a backside of a substrate clamped by the substrate holder. Such a backfill gas enhances the heat transfer capability from the substrate to the substrate holder. In order not to spill this backfill gas in vacuum operating conditions, the clamping pressure should be larger than the backfill gas pressure, and in order to provide a leak-tight confinement, a wall is present having a contour that generally follows the contour of the substrate and which provides, when the substrate contacts the substrate holder, a gas-tight environment.

European patent application EP0947884 describes a lithographic apparatus having a substrate holder in which protrusions are arranged to improve the flatness of the substrate. These protrusions have a general diameter of 0.5 mm and are located generally at a distance of 3 mm away from each other and thereby form a bed of supporting members that support the substrate. A typical height of the protrusions is 5 µm. However, for electrostatic clamping configurations, especially for electrostatic clamping configurations where a hard rim is present for confining a backfill gas to the back of a substrate to be irradiated, the substrate tends to be supported unevenly, especially near the boundary of the protrusion configuration, due to the termination of support near the boundary edge. This may cause, depending on the degree of overhang, an upward lifting of the wafer or a downward "sagging" near the edges, which may result in unacceptable imaging quality.

SUMMARY

It is an aspect of the invention to provide a photolithographic apparatus in which the problem of unevenness of the substrate support near the boundary of the substrate holder is addressed and the substrate is leveled in a controllable way near the edges of the substrate.

In an embodiment, a lithographic apparatus is provided. The lithographic apparatus includes a radiation system for providing a beam of radiation, and a substrate holder for supporting a substrate to be placed in a beam path of the beam of radiation. The substrate holder includes a plurality of protrusions that define a protrusion configuration for providing a substantially flat plane of support for supporting a substantially flat substrate. The substrate holder also includes at least one clamping electrode for generating an electric field, for clamping the substrate against the substrate holder by the electric field. The substrate holder further includes a peripheral supporting edge arranged to contact a substrate.

By extending the clamping electrode beyond the last supporting edge of the substrate holder, in a controllable way, the clamping pressure near the boundaries of the substrate may be varied. Thus, depending on the size of the substrate in relation to the size of the support defined by the protrusion configuration, the electrode may be extended outside the peripheral edge in order to provide an optimum downward torsion moment for the substrate near the edges. In an embodiment, the protrusion configuration is arranged in a series of concentric circles, the circles being mutually separated over a distance a, and wherein the electrode extension generates a torsion load that ranges from 0.1 and 3 times a reference torsion load defined by $M=\frac{1}{12}\Delta p a^2$, wherein $\Delta p$ is an applied clamping pressure. In such a range, it may be shown that the bending moments introduce optimal height differences of the substrate near the supporting edge.

In an embodiment, a lithographic apparatus is provided. The apparatus includes a radiation system for providing a beam of radiation, and a substrate holder. The substrate holder includes a plurality of protrusions for providing a substantially flat plane of support for supporting a substrate in a beam path of the beam of radiation, at least one clamping electrode for generating an electric field for clamping the substrate against the substrate holder, and a peripheral supporting edge arranged to contact the substrate. At least one electrode extends beyond said peripheral supporting edge for providing a torsion load to level the substrate near the edges of the substrate.

In an embodiment in which the protrusion configuration is arranged in a series of concentric circles, the electrode extension preferably satisfies the relationship of $0.3 < b/a < 0.4$, wherein b is the distance of the electrode extension and a the mutual separation between two concentric circles nearest the peripheral supporting edge.

In an embodiment, a substrate holder for a lithographic projection apparatus is provided. The substrate holder includes a plurality of protrusions for providing a substantially flat plane of support for supporting a substrate, at least one clamping electrode for generating an electric field for clamping the substrate against the substrate holder, and a peripheral supporting edge arranged to contact the substrate. The at least one electrode extends beyond the peripheral supporting edge for providing a torsion load to level the substrate near the edges of the substrate.

In an embodiment, the substrate holder includes a ground electrode extending around the peripheral supporting edge. By such a ground electrode, the electrostatic fields on the boundary of the electrodes are well-defined and therefore, the electrostatic forces are controllable near the boundaries.

In an embodiment, the clamping electrode includes an electric field attenuator that is configured in a configuration complementary to the protrusion configuration. The electric field attenuator may include a dielectric layer and/or a ground layer. In this way, the electrostatic force that is developed between the substrate and the substrate holder is attenuated in between the protrusions with respect to the electric forces that are present between protrusions and the backside of the substrate. Correspondingly, the degree of bending in between the protrusions may be lowered significantly.

In an embodiment, a lithographic projection apparatus is provided. The apparatus includes a radiation system for providing a beam of radiation, and a substrate holder. The substrate holder includes a plurality of protrusions for providing a substantially flat plane of support for supporting a substrate in a beam path of the beam of radiation, at least one clamping electrode for generating an electric field for clamping the substrate against the substrate holder, and a peripheral supporting edge arranged to contact the substrate. The clamping electrode includes an electric field attenuator that is configured to provide electric field attenuation substantially complementary to the protrusions for concentrating the electric field pressure close to the protrusions.

In an embodiment, the lithographic projection apparatus includes a radiation system for providing a beam of radiation, and a patterning device holder. The patterning device holder includes a plurality of protrusions for providing a substantially flat plane of support for supporting a patterning device in a beam path of the beam of radiation, at least one clamping electrode for generating an electric field for clamping the patterning device against the holder, and a peripheral supporting edge arranged to contact the patterning device. The electrode extends beyond the peripheral supporting edge for providing a torsion load to level the patterning device near the edges of the patterning device.

In an embodiment, a method for manufacturing a device using a lithographic apparatus is provided. The method includes patterning a beam of radiation with a patterning device, projecting the patterned beam of radiation onto a target portion of a substrate, and supporting the substrate with a substrate holder. The substrate holder includes a plurality of protrusions for providing a substantially flat plane of support for supporting the substrate, and a peripheral supporting edge arranged to contact the substrate. The method also includes generating an electric field for clamping the substrate against the holder and at a position that provides a torsion load to the substrate to level the substrate near the edges of the substrate.

In an embodiment, a method for manufacturing a device using a lithographic apparatus is provided. The method includes patterning a beam of radiation with a patterning device that is supported by a patterning device holder, and projecting the patterned beam of radiation onto a target portion of a substrate. The holder includes a plurality of protrusions for providing a substantially flat plane of support for supporting the patterning device, and a peripheral supporting edge arranged to contact the patterning device. The method also includes generating an electric field for clamping the patterning device against the holder and at a position the provides a torsion load to level the patterning device near the edges of the patterning device.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
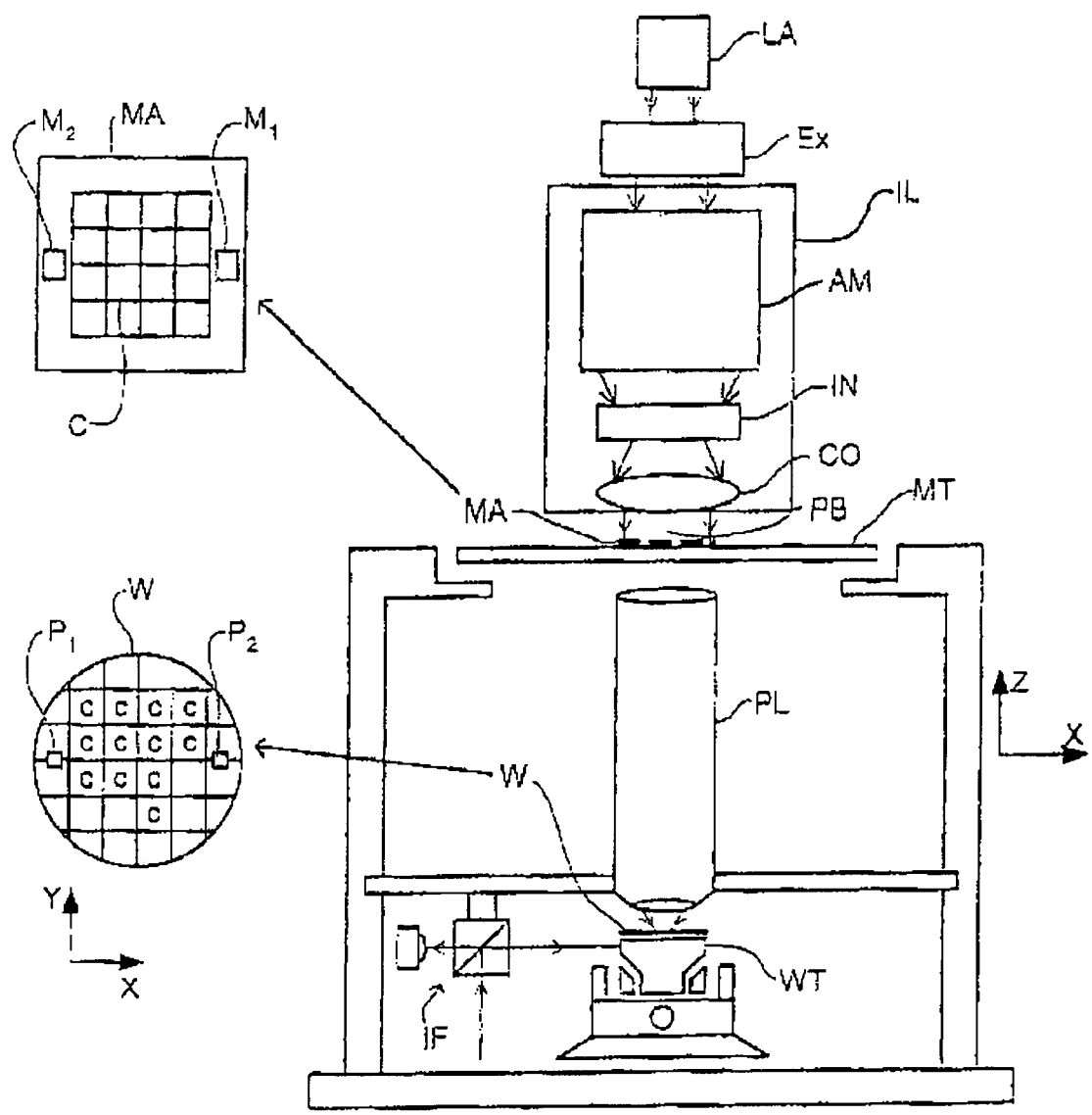
FIG. 1 depicts a lithographic projection apparatus according to an embodiment of the invention.

FIG. 1 schematically depicts a lithographic projection apparatus according to a particular embodiment of the invention. The apparatus includes a radiation system for supplying a projection beam PB of radiation (e.g. light in the deep ultraviolet region). In this particular case, the radiation system also includes a radiation source LA. The apparatus also includes a first object table (mask table) MT provided with a mask holder for holding a mask MA (e.g. a reticle), and connected to a first positioning device for accurately positioning the mask with respect to item PL, a second object table (substrate table) WT provided with a substrate holder for holding a substrate W (e.g. a resistcoated silicon wafer), and connected to a second positioning device for accurately positioning the substrate with respect to item PL, and a projection system ("lens") PL for imaging an irradiated portion of the mask MA onto a target portion C (e.g. including one or more dies) of the substrate W. The term mask table as used herein can also be considered or termed a mask support. It should be understood that the term mask support or mask table broadly refers to a structure that supports, holds, or carries a substrate.

As here depicted, the apparatus is of a transmissive type (i.e. has a transmissive mask). However, in general, it may also be of a reflective type, for example, with a reflective mask. Alternatively, the apparatus may employ another kind of patterning device, such as a programmable mirror array of a type as referred to above.

The source LA (e.g. an excimer laser source) produces a beam of radiation. This beam is fed into an illumination system (illuminator) IL, either directly or after having traversed a conditioning device, such as a beam expander Ex, for example. The illuminator IL may include an adjusting device AM for setting the outer and/or inner radial extent (commonly referred to as s-outer and s-inner, respectively) of the intensity distribution in the beam. In addition, it will generally include various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). This latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device (and an interferometric measuring device IF), the substrate table WT can be moved accurately, e.g. so as to position different target portions C in the path of the beam PB. Similarly, the first positioning device can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
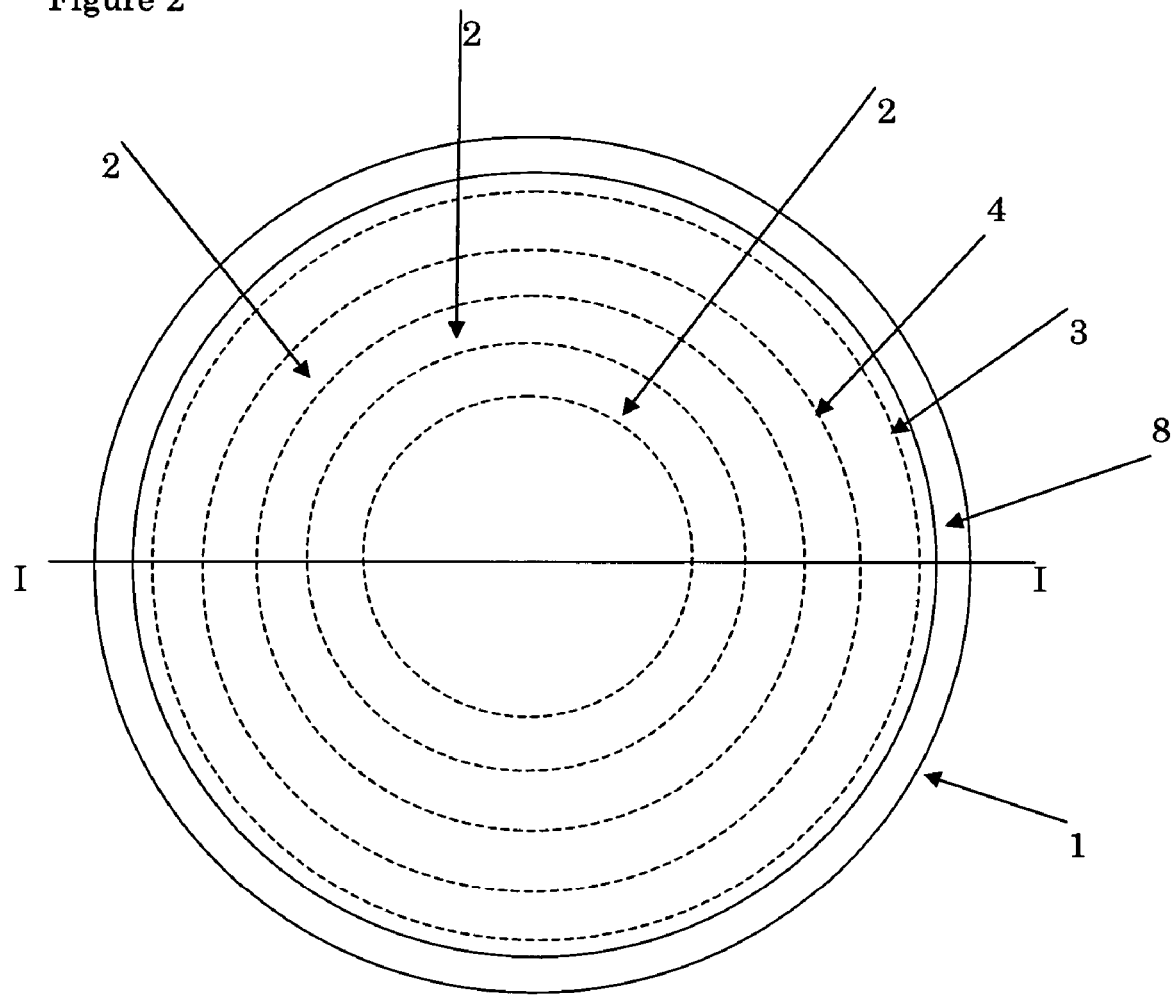
FIG. 2 depicts a schematic plan view of a substrate holder according to the invention.

In FIG. 2, a substrate holder 1 according to the invention is illustrated. In the figure, a plurality of protrusions 2 are pictured and are represented by dotted lines. As shown, the protrusions 2 are oriented in substantially concentric circles. These protrusions have a general diameter of 0.5 mm and are located generally at a distance of 3 mm away from each other and thereby form a bed of supporting members that support the substrate. By reference numerals 3 and 4, outermost circles of protrusions are referenced, having a mutual separation of distance a (see FIG. 3). A peripheral supporting edge is indicated by reference numeral 3. Furthermore, an electrode that extends beyond the peripheral supporting edge 3 is indicated by reference numeral 8. In this respect it is noted, that the peripheral supporting edge 3 may be in the form of a wall having a contour that generally follows the contour of the substrate and which provides, when the substrate contacts the substrate holder 1, a gas-tight environment. Otherwise, the peripheral supporting edge 3 may include a plurality of mutually separated protrusions, hence forming an outermost circle of protrusions. In this setup, a sealing edge (not shown) may be present that does not support the substrate but substantially prevents the backfill gas from leaking out.

Figure 3:
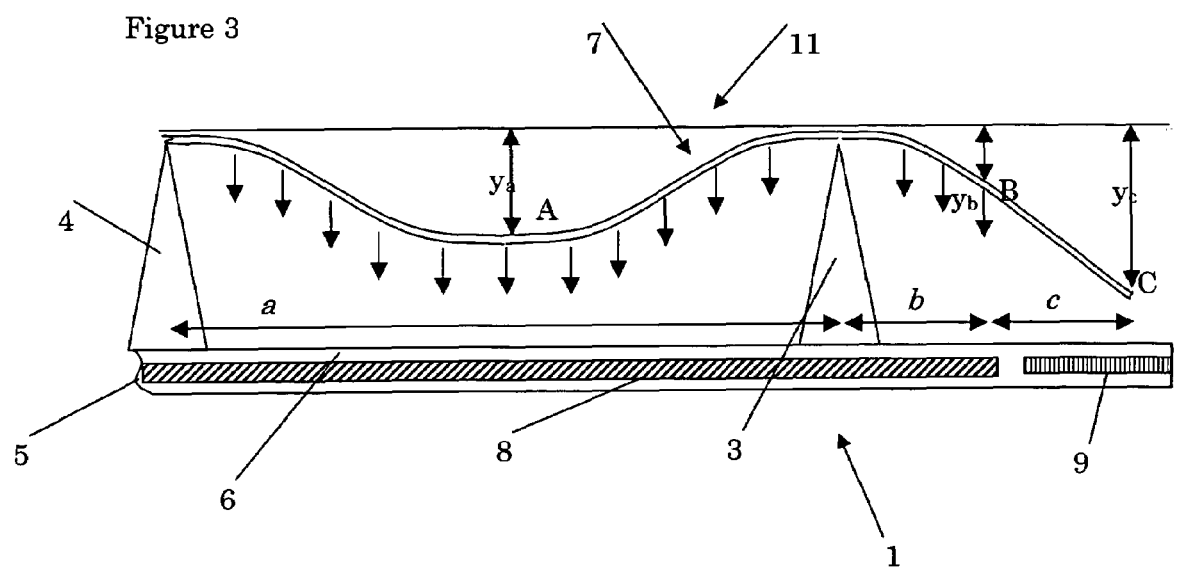
FIG. 3 depicts a schematic partial view of the substrate of FIG. 2 along the line I—I.

FIG. 3 is a schematic side view along the lines I—I of FIG. 2. In this figure, the outermost protrusion 3 and the next to last outermost protrusion 4 are illustrated in a schematic way, outermost protrusion 3 thus forming the peripheral supporting edge 3. In the figure, the substrate holder 1 and substrate 7 extend towards the left hand side of the figure, schematically indicated by curved line 5. The protrusions 3 and 4 are supported by a base plate 6. The base plate is usually made of an electric isolator, and such materials are known in the art (for example, ULE® manufactured by Corning, and sapphire). The protrusions, of which protrusions 3, 4 are shown, define a protrusion configuration for providing a substantially flat plane of support. In this way, a substantially flat substrate 7 is supported. In practice, the outermost protrusion 3 may be of a surrounding wall type, whereas the inner protrusions are usually cylindrical in form, so that a peripheral supporting edge surrounds the inner protrusions. In this way, for an electrostatic clamp, a gas-tight confinement may be rendered, wherein a backfill gas is confined by the backside of substrate 7, peripheral supporting edge 3 and base plate 6.

A clamping electrode 8 that is embedded in the base plate that extends beyond the peripheral supporting edge 3 is also illustrated. In this respect, the term buried is used, since as a general rule, the electrode 8 is covered by insulating material. Here, since the clamping electrode 8 extends beyond the last supporting edge of the substrate holder, in a controllable way, the clamping pressure near the boundaries of the substrate may be varied. Thus, depending on the size of the substrate 7 in relation to the size of the support defined by the protrusion configuration, the electrode 8 may be extended outside the peripheral edge 3 in order to provide an optimum downward torsion moment for the substrate 7 near the edges. Ground electrode 9 extends around the clamping electrode 8 and peripheral supporting edge 3. The electrostatic fields on the boundary of the electrodes 8 and 9 are well-defined near the boundaries.

The distance between two protrusions 3, 4 is indicated by a. A distance of extension that is covered by an electrode 8 that extends beyond the peripheral supporting edge 3 is indicated by b. An optional extra overhanging distance, indicated by c, of the substrate 7 between an outer edge of the clamping electrode 8 and the edge of the substrate 10, in addition to the overhang that is covered by clamping distance b.

From one-dimensional beam theory, the torsion moments near supporting edge 3 may be calculated as counterclockwise torsion moment $M_a$ (clamped beam configuration), and clock-wise torsion moment $M_b$ (cantilevered beam configuration).

$$\left. \begin{array}{l} M_a = \dfrac{\Delta p a^2}{12} \text{ with } \theta_a = 0 \\ M_b = \dfrac{\Delta p b^2}{2} \text{ with } \theta_a = 0 \end{array} \right\} M_a = M_b \rightarrow b = 0.4a$$

In Equation 1, $\Delta p$ is the clamping pressure exerted by electrode 8, a is the distance between outermost supporting edge 3 and the next to last outermost protrusion 4, b is the clamping distance and $\theta_a$ is the counterclockwise rotation of the substrate near supporting edge 3. From the equation, it is apparent that for an unrotated configuration, the clamping distance should be extended over a distance equal to 0.4 times the supporting distance a between the supporting protrusions. Furthermore, when the degree of unclamped overlap of the substrate indicated by c in FIG. 3 is large in comparison with the supporting distance (in the order often times or larger), the substrate near the boundary tends to run out of the optimum depth of focus plane, substantially located at the plane of support formed by protrusions 3 and 4. By varying the clamping distance b in relation to the degree of overhang c of the wafer, an optimum depth of focus for all areas on the substrate can be provided, where, depending on the magnitude of distance c, distance b may be chosen smaller or larger.

Typical values of c may range between 0 and 10 times the supporting distance a, and typically values of b may range between 0.1 and 0.7 times the supporting distance a.

Table 1 below shows the results for five load cases:

1. the optimum distance b when the rotation of the substrate at the last supporting edge 3 is zero.

2. the optimum distance b for equal deflection at the substrate edge 10 and the substrate between the supporting protrusions, for a "small" substrate extension (b+c=2a)

3. the optimum distance b for equal deflection at the substrate edge 10 and the substrate between the supporting protrusions, for a "large" substrate extension (b+c=10a)

4. the optimum distance b for a maximum upward deflection of the wafer edge of 160 nm 5. the optimum distance b for a maximum upward downward of the wafer edge of 160 nm.

TABLE 1

| | Substrate | Total substrate deflection $y_{tot}$ at location: | | | Bending load | |
|---|---|---|---|---|---|---|
| | Effective clamp extension b/a | edge extension (b + c)/a | left of last burl A | effective edge of clamp B | edge of wafer C | from clamp extension $M_b$/M | Design target |
| 1 | 0.408 | 2 | 2.46 | 3.26 | 20 | 1 | $y_b = y_a$ |
| 2 | 0.353 | 2 | 3.19 | 0.07 | 3.27 | 0.74 | $y_c = y_a$, small c |
| 4 | 0.342 | 10 | 3.33 | −0.40 | 3.34 | 0.70 | $y_c = y_a$, large c |
| 3 | 0.160 | 10 | 4.92 | −2.58 | −160 | 0.15 | $y_c >= -160$ nm, all c's |
| 5 | 0.680 | 2 | −2.71 | 48 | 160 | 2.77 | $y_c <= 160$ nm, all c's |

The column $M_b/M$ shows the variation in bending moment in the wafer just outside the last supporting edges for these designs. A range of about 0.1 to 3 is seen to envelop many optimum designs. Here, $M_b$ is the actual bending moment that the electro-static clamp applies to the wafer just outside the last protrusion. M is a reference moment defined from the average constant electro-static clamp load and the protrusion pitch. Further, in the table, ya, yb, yc, denote the vertical substrate deflection from a flat reference plane that is parallel to the plane of support 11 defined by protrusions 3, 4, near positions A, B and C, indicated in FIG. 3.

Figure 4:
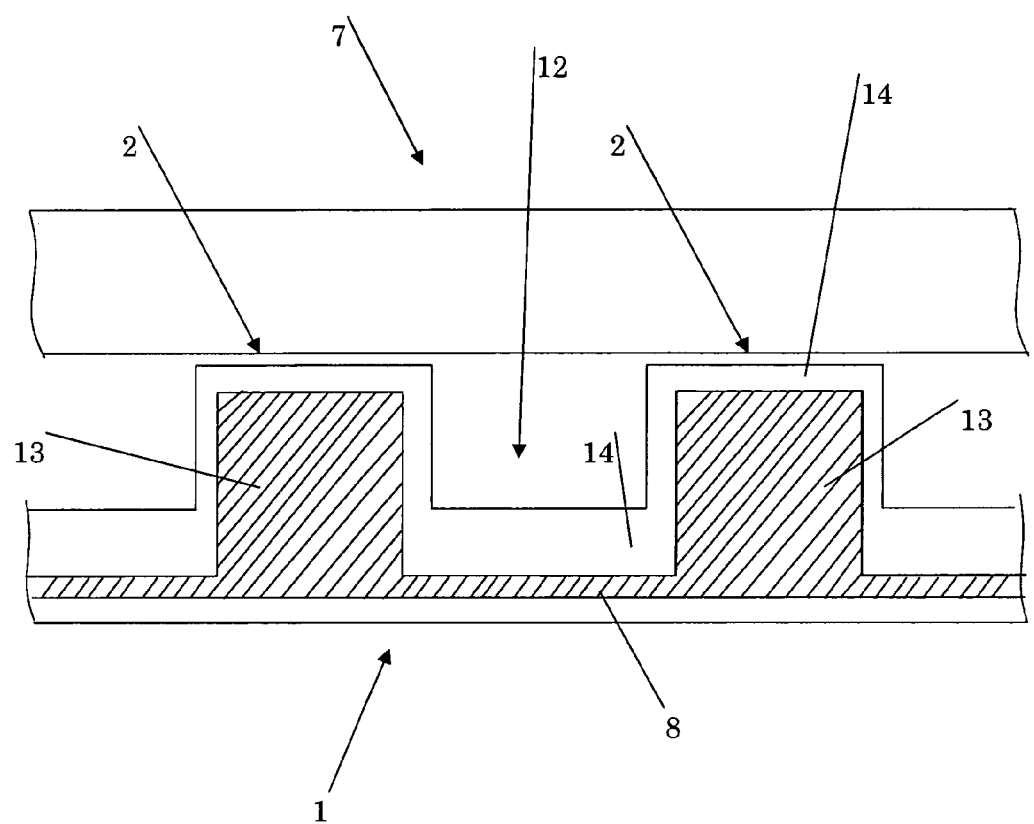
FIG. 4 depicts a detailed cross-sectional view of another embodiment of a substrate holder according to the invention.

FIG. 4 depicts a detailed cross-sectional view of another embodiment of a substrate holder according to the invention. In this embodiment, the deflection effects of electrostatic clamping are further mitigated by introducing an electric field attenuator that is configured in a configuration substantially complementary to the protrusion configuration. More specifically, FIG. 4 shows a substrate holder 1 including protrusions 2, wherein the distance between the electrode 8 and the substrate 7 in the areas between the protrusions 2 is enlarged. Hence in the clamping electrode 8, recesses 12 are formed in between two neighboring protrusions 2, so that the electrostatic forces are reduced inversely proportional to the distance between the electrode 8 and the substrate 7. Furthermore, in this embodiment, the electrode 8 is formed to have upstanding elements 13, protruding into protrusions 2, thus enlarging the electrostatic forces exerted on protrusions 2 in the direct supporting area of the protrusions. Since the electrostatic pressure in the unsupported areas between the protrusions 2 is substantially lowered, deflection will be less and thereby the focus error and overlay errors of a photolithographic illumination process will be reduced. Typical dimensions are a protrusion height of 5 μm, a surface roughness of 30 nm and an applied electrostatic load of 3 kV. In such a configuration, assuming that the electrostatic clamp is covered by a dielectric layer 14 of at least 20 μm having a dielectrical constant of 4 F/m and of 300 μm in the areas in between the protrusions, no gap voltages of more than 350 V occur throughout the substrate holder, thus preventing breakthrough. The applied voltage gives rise to a total estimated clamping pressure of 16 bar on the protrusions and 0.06 bar in between the protrusions.

Figure 5:
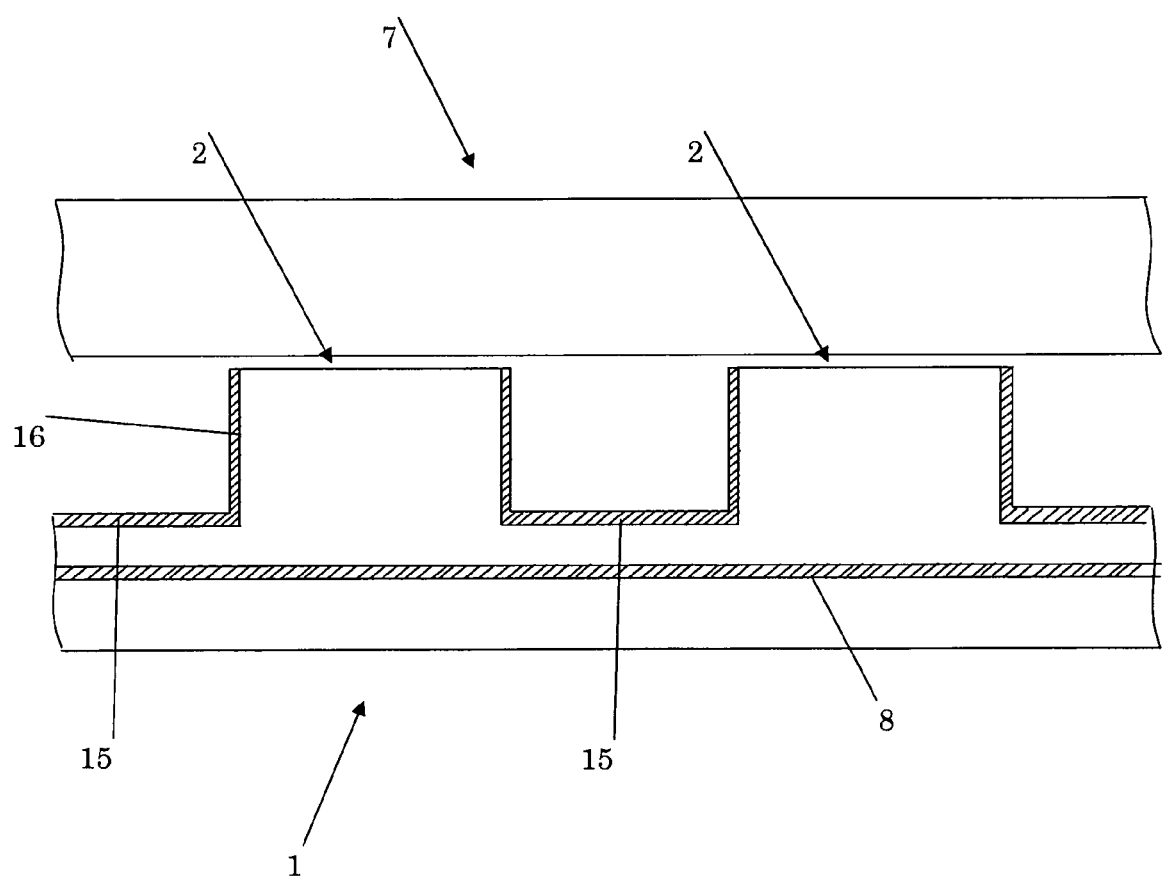
FIG. 5 depicts a detailed cross-sectional view of another embodiment of a substrate holder according to the invention.

FIG. 5 depicts a detailed cross-sectional view of yet another embodiment of a substrate holder according to the invention. In this embodiment, the deflection effects of electrostatic clamping are mitigated by introducing an ground layer 15 shielding the electrostatic fields in between the protrusions. The ground layer 15 may be a cover layer, but may also be buried in the substrate holder 1. In FIG. 5, a configuration is depicted where side walls 16 of the protrusions are also covered by the ground layer 15. This offers an additional benefit that the substrate 7 is grounded. In addition, such a substrate holder may be manufactured quite easily after covering a substrate holder by a metal layer, the protrusion tops may be cleared and smoothed by a polishing process or the like.

The skilled artisan will appreciate that, in the context of such alternative applications, any use of the terms "reticle" or "wafer" or "substrate" in this text should be considered as being replaced by the more general terms as any article to be placed in the beam path. Such article may encompass patterning devices, the patterning device serving to impart the projection beam with a pattern in its cross-section or a substrate to be patterned by a patterned beam onto a target portion of the substrate. In addition the following definitions are given to illustrate general and specific contexts of certain concepts that are used in this text. The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing a piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using a suitable electronic device. In both of the situations described hereabove, the patterning devices can include one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. including one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection bean in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

Further, the lithographic apparatus may be of a type having two or more wafer tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm), as well as particle beams, such as ion beams or electron beams.

While specific embodiments of the invention have been described above, it will be appreciated that the invention may be practiced otherwise than as described. For instance, where the examples describe the substrate holder as a wafer table, for holding a substrate to be patterned by a patterned beam onto a target portion of the substrate, in some embodiments (particularly, in embodiments using a reflective mask), also, the substrate holder may be a support for supporting patterning devices, the patterning devices serving to impart the projection beam with a pattern in its cross-section. The description is not intended to limit the invention.

What is claimed is:

1. A lithographic projection apparatus comprising:
a radiation system for providing a beam of radiation; and
a substrate holder comprising
    a plurality of protrusions for providing a substantially flat plane of support for supporting a substrate in a beam path of said beam of radiation;
    at least one clamping electrode for generating an electric field for clamping the substrate against the substrate holder; and
    a peripheral supporting edge arranged to contact the substrate,
wherein said at least one electrode extends beyond said peripheral supporting edge and is configured to generate a torsion load that ranges from 0.1 and 3 times a reference torsion load defined by $$M = \frac{1}{12}\Delta p a^2,$$

to level the substrate near the edges of the substrate, and wherein $\Delta p$ is an applied clamping pressure and a is an average distance between two protrusions.

2. A lithographic projection apparatus according to claim 1, wherein said protrusion configuration is arranged in a series of concentric circles, and wherein said electrode extension satisfies the relationship of 0.3<b/a<0.6, wherein b is the distance of the electrode extension and a the mutual separation between two concentric circles nearest the peripheral supporting edge.

3. A lithographic projection apparatus according to claim 1, wherein said substrate holder comprises a ground electrode extending along the peripheral supporting edge.

4. A lithographic projection apparatus according to claim 1, wherein said clamping electrode comprises an electric field attenuator that is configured to provide electric field attenuation substantially complementary to the protrusion configuration for concentrating the electric field pressure close to the protrusions.

5. A lithographic projection apparatus according to claim 4, wherein said electric field attenuator comprises a dielectric layer having a dielectric constant of 4 F/m and a thickness of at least 20 μm and/or a ground layer.

6. A lithographic projection apparatus according to claim 4, wherein said clamping electrode is recessed in between two neighboring protrusions.

7. A lithographic projection apparatus according to claim 4, wherein said clamping electrode protrudes into each of said protrusions.

8. A lithographic apparatus according to claim 7, wherein said clamping electrode is covered by a dielectric layer having a dielectric constant of 4 F/m, and a thickness of at least 20 μm.

9. A lithographic projection apparatus according to claim 1, wherein said substrate holder is a support table for holding a substrate to be patterned by a patterned beam onto a target portion of the substrate.

10. A substrate holder for a lithographic projection apparatus, said substrate holder comprising:
    a plurality of protrusions for providing a substantially flat plane of support for supporting a substrate;
    at least one clamping electrode for generating an electric field for clamping the substrate against the substrate holder; and
    a peripheral supporting edge arranged to contact the substrate,
    wherein said at least one electrode extends beyond said peripheral supporting edge and is configured to generate a torsion load that ranges from 0.1 and 3 times a reference torsion load defined by $$M = \frac{1}{12}\Delta pa^2,$$

to level the substrate near the edges of the substrate, and wherein Δp is an applied clamping pressure and a is an average distance between two protrusions.

11. A lithographic projection apparatus comprising:
    a radiation system for providing a beam of radiation; and
    a patterning device holder comprising
      a plurality of protrusions for providing a substantially flat plane of support for supporting a patterning device in a beam path of said beam of radiation;
      at least one clamping electrode for generating an electric field for clamping the patterning device against the holder; and
      a peripheral supporting edge arranged to contact the patterning device,
    wherein said at least one electrode extends beyond said peripheral supporting edge and is configured to generate a torsion load that ranges from 0.1 and 3 times a reference torsion load defined by $$M = \frac{1}{12}\Delta pa^2,$$

to level the patterning device near the edges of the patterning device, and wherein Δp is an applied clamping pressure and a is an average distance between two protrusions.

12. A method for manufacturing a device using a lithographic apparatus, the method comprising:
    patterning a beam of radiation with a patterning device;
    projecting said patterned beam of radiation onto a target portion of a substrate; and
    supporting the substrate with a substrate holder,
    wherein said substrate holder comprises a plurality of protrusions for providing a substantially flat plane of support for supporting the substrate, and a peripheral supporting edge arranged to contact the substrate; and
    generating an electric field for clamping the substrate against the holder and at a position that provides a torsion load in a range from 0.1 and 3 times a reference torsion load defined by $$M = \frac{1}{12}\Delta pa^2,$$

to the substrate to level the substrate near the edges of the substrate, wherein Δp is an applied clamping pressure and a is an average distance between two protrusions.

13. A method for manufacturing a device using a lithographic apparatus, the method comprising:
    patterning a beam of radiation with a patterning device that is supported by a patterning device holder; and
    projecting said patterned beam of radiation onto a target portion of a substrate,
    wherein said patterning device holder comprises a plurality of protrusions for providing a substantially flat plane of support for supporting the patterning device, and a peripheral supporting edge arranged to contact the patterning device; and
    generating an electric field for clamping the patterning device against the holder and at a position that provides a torsion load in a range from 0.1 and 3 times a reference torsion load defined by $$M = \frac{1}{12}\Delta pa^2,$$

to level the patterning device near the edges of the patterning device, wherein Δp is an applied clamping pressure and a is an average distance between two protrusions.

14. A lithographic projection apparatus comprising:
    a radiation system for providing a beam of radiation; and
    a substrate holder comprising
      a plurality of protrusions arranged in a series of concentric circles for providing a substantially flat plane of support for supporting a substrate in a beam path of said beam of radiation;
      a peripheral supporting edge arranged to contact the substrate; and
      a clamping electrode for generating an electric field for clamping the substrate against the substrate holder, said clamping electrode extending beyond said peripheral supporting edge to satisfy the relationship of 0.3<b/a<0.6, wherein b is the distance of the electrode extension and a is the mutual separation between two concentric circles nearest the peripheral supporting edge, said clamping electrode being configured to generate a torsion load that ranges from 0.1 and 3 times a reference torsion load defined by $$M = \frac{1}{12}\Delta p a^2,$$

to level the substrate near the edges of the substrate, $\Delta p$ being an applied clamping pressure.

15. A substrate holder for a lithographic projection apparatus, said substrate holder comprising:
   a plurality of protrusions arranged in a series of concentric circles for providing a substantially flat plane of support for supporting a substrate;
   a peripheral supporting edge arranged to contact the substrate; and
   a clamping electrode for generating an electric field for clamping the substrate against the substrate holder, said clamping electrode extending beyond said peripheral supporting edge to satisfy the relationship of $0.3 < b/a < 0.6$,
   wherein b is the distance of the electrode extension and a is the mutual separation between two concentric circles nearest the peripheral supporting edge, said clamping electrode being configured to generate a torsion load that ranges from 0.1 and 3 times a reference torsion load defined by $$M = \frac{1}{12}\Delta p a^2,$$

to level the substrate near the edges of the substrate, $\Delta p$ being an applied clamping pressure.

* * * * *